United States Patent [19]
Takatani et al.

[11] Patent Number: 5,508,554
[45] Date of Patent: Apr. 16, 1996

[54] SEMICODUCTOR DEVICE HAVING DEFECT TYPE COMPOUND LAYER BETWEEN SINGLE CRYSTAL SUBSTRATE AND SINGLE CRYSTAL GROWTH LAYER

[75] Inventors: Shinichiro Takatani, Koganei; Takeshi Kikawa, Hachioji; Yoko Uchida, Kawasaki, all of Japan

[73] Assignee: Hitachi, Ltd., Tokyo, Japan

[21] Appl. No.: 294,504

[22] Filed: Aug. 23, 1994

[30] Foreign Application Priority Data

Aug. 26, 1993 [JP] Japan ................................ 5-211179

[51] Int. Cl.⁶ ...................... H01L 29/30; H01L 31/0328; H01L 31/0336
[52] U.S. Cl. .................... 257/617; 257/192; 257/197
[58] Field of Search .................................. 257/617, 590, 257/192, 194, 197, 198, 611, 612

[56] References Cited

U.S. PATENT DOCUMENTS 4,752,818   6/1988   Kushida et al. .................. 257/617
5,258,631  11/1993   Usagawa et al. ................. 257/617

FOREIGN PATENT DOCUMENTS

0327316   8/1989   European Pat. Off. .......... 257/617

*Primary Examiner*—Wael M. Fahmy
*Attorney, Agent, or Firm*—Antonelli, Terry, Stout & Kraus

[57] ABSTRACT

Disclosed is a semiconductor device capable of suppressing the generation of dislocations due to the difference in lattice constant by insertion of one or more defect type compound layers in a semiconductor layered structure. The strain generated by the mismatch of the lattice is relaxed by a large amount of vacancies contained in the defect type compound layer, to suppress the generation and the propagation of dislocations, thus inexpensively fabricating a semiconductor device with less deterioration of the characteristics due to defects with good repeatability.

25 Claims, 11 Drawing Sheets

FIG. 11d ammit

SEMICODUCTOR DEVICE HAVING DEFECT TYPE COMPOUND LAYER BETWEEN SINGLE CRYSTAL SUBSTRATE AND SINGLE CRYSTAL GROWTH LAYER

BACKGROUND OF THE INVENTION

The present invention relates to a semiconductor layered structure and a semiconductor device using the layered structure, and particularly to a layered structure composed of different semiconductor layers capable of reducing defects and a semiconductor device using the layered structure.

In recent years, layered structures composed of different semiconductor layers are extensively used for realizing various semiconductor devices or improving the performances thereof.

Of these semiconductor layered structures, a type with a large lattice mismatch has a disadvantage in generating defects, which are called dislocations, in a single crystal growth layer formed on a single crystal substrate. Such dislocations are generated during the growth of a single crystal growth layer, and some cases, they are generated to relax strains caused by a difference in thermal expansion coefficient in a process of cooling the substrate after the growth. The generation of dislocations causes the scattering of carriers, reduction of the activation ratio of n-type and p-type impurities, and lowering of the life due to re-combination of minority carriers, thus deteriorating the characteristics of semiconductor devices.

Some attempts have been made to reduce the above dislocations in a single crystal growth layer. For example, in Oyobuturi Vol. 61, No. 2, P. 126 (in Japanese), GaAs is grown on Si by a two-step growth method, wherein a vicinal substrate is used and a strained layer super lattice is inserted.

Another method has been disclosed in Extended Abstracts (The 53rd Autumn Meeting, 1992); The Japan Society of Applied Physics (p. 303), wherein an intermediate layer of InAs is inserted at the interface of a layered structure composed of an Si layer and a GaAs layer, to confine dislocations in the InAs layer, thus reducing the dislocations in the GaAs layer equivalent to the above-described single crystal growth layer. In this method, only the InAs layer having a low melting point is melted by heating the layered structure, to generate dislocations in the InAs layer, thus relaxing a strain energy stored in the GaAs layer.

SUMMARY OF THE INVENTION

An object of the present invention is to provide a new semiconductor layered structure capable of reducing dislocations and a semiconductor device using the layered structure. Here, the semiconductor layered structure is defined such that a single crystal growth layer is made of a semiconductor, and that the difference in lattice constant between a single crystal substrate and the single crystal growth layer and the thickness of the single crystal growth layer satisfy the condition of generating dislocations in the single crystal growth layer. The lattice constant in the present invention means the lattice constant in the direction parallel to the surface of a substrate on which a single crystal growth layer is grown (hereinafter, referred to as "parallel lattice constant"). The material used for a single crystal substrate is not limited to a semiconductor, and may include, for example an insulating material.

The above object can be achieved by provision of a single crystal compound layer having a defect-type lattice (hereinafter, referred to as "defect-type compound layer"), which is inserted between a single crystal substrate and a single crystal growth layer so as to be contacted therewith. One or plurality of the defect-type compound layers may be used. The thickness of each defect-type compound layer is determined such that any dislocation is not generated in the layer itself during formation of the layer. In the structure using a plurality of defect-type compound layers, each layer made of the same material as a single crystal growth layer and each defect-type compound layer are alternately superimposed, and the both ends of the structure are formed of the defect-type compound layers.

In other words, the above object can be achieved by provision of a semiconductor device having a semiconductor layered structure, which includes a single crystal substrate, a single crystal growth layer made of a semiconductor formed on the single crystal substrate, and a defect-type compound layer inserted between the single crystal substrate and the single crystal growth layer so as to be contacted therewith. Here, the materials of the single crystal substrate and the single crystal growth layer, and the thickness of the single crystal growth layer are determined such that, when another single crystal substrate made of the same material of the above single crystal substrate is prepared, and a layer made of the same material as the single crystal growth layer is directly grown on the another single crystal substrate to the same thickness as that of the single crystal growth layer without the defect type compound layer, dislocations are generated in the layer made of the same material as the single crystal growth layer. Moreover, the thickness of the defect-type compound layer is determined such that, when another single crystal substrate made of the same material as the above single crystal substrate is prepared, and a layer made of the same material as the defect type compound layer is grown on the another single crystal substrate to the same thickness as that of the defect type compound layer, any dislocation is not generated in the layer made of the same material as the defect type compound layer.

The defect type compound means the compound having such a chemical formula that it has a stoichiometric composition but part of lattice sites of the crystal structure becomes vacant. This is represented by a chalcogenite of a III-group element, that is, a III–VI compound having a composition of two atoms of a III-group element and three atoms of a VI-group element, for example, $Ga_2Se_3$, $Ga_2S_3$, $Ga_2Te_3$. The above III–VI compound has basically the same or similar zincblende structure as or to that of GaAs. However, in this compound, one-third the lattice sites of III-group atoms (cations) become vacant. In addition, the defect type compound in the present invention may include a mixture of the above III–VI compounds, and further, it may include a compound represented by $Ag_2HgI_4$, $HgGa_2Te_4$ or the like in which one-fourth the lattice sites of cations become vacant.

When a defect type compound layer is epitaxially grown on a single crystal substrate to a thickness not to generate dislocations, the parallel lattice constant of the defect type compound layer is equal to that of the single crystal substrate. The minimum thickness of the defect type compound layer is the level of monolayer.

When a single crystal growth layer is epitaxially grown on such a defect type compound layer, the single crystal growth layer is started to grow in the state that the parallel lattice constant thereof is equal to those of the defect type compound layer and the single crystal substrate. During this growth, a strain energy caused by the growth of the single crystal growth layer with a parallel lattice constant different from that of the bulk (the lattice constant in the state with no strain energy) is stored in the single crystal growth layer. When the single crystal growth layer is made thick up to the state that the stored strain energy exceeds the restricting force of the defect type compound to the single crystal compound layer, the stored strain energy is started to be relaxed, and thereby dislocations are generated in the defect type compound layer and are confined therein. As a result, the parallel lattice constant of the single crystal growth layer becomes close to the lattice constant of the bulk, and the dislocations in the single crystal growth layer are reduced by the amount confined in the defect type compound layer. Therefore, the object of the present invention can be achieved.

In the case of using a plurality of defect type compound layers, each defect type compound layer acts not only as a layer of confining dislocations but also as a layer for shielding the propagation of dislocations to the next layer, which makes it possible to further reduce the amount of dislocations in the final single crystal growth layer.

The defect type compound has a stoichiometric composition, and thereby vacancies in the defect type compound have no dangling bond causing the formation of electronic state. Accordingly, there is no fear in deteriorating the performance of a semiconductor device by insertion of the defect type compound layer.

Although being limited to the case where each of the crystal structures of a substrate and a single crystal growth layer is a cubic structure, the thickness of a single crystal growth layer can be obtained by the following equation (1) which is based on a mechanical equilibrium model (see Journal of Vacuum Science and Technology, Vol. 12, p. 126).

$$hc = bx(\ln(hc/b)+1)/8\pi f f'(1+v) \quad (1)$$

where hc is a critical film thickness, <b> is Burger's vector, <f> is a lattice mismatch value, and v is Poisson ratio.

For example, the lattice mismatch value <f> is about 4% for the case of GaAs layer/Si substrate; and about 4% for the case of InGaAs layer/GaAs substrate where the alloy ratio <x> of $In_xGa_{1-x}As$ is about 0.5.

DETAILED DESCRIPTION OF THE PREFERRED EMBODIMENTS

Hereinafter, the present invention will be more fully described by way of embodiments with reference to the drawings.

<Embodiment 1>

In this embodiment, there will be described a method of forming a semiconductor layered structure, which is applied to the cases that an InGaAs layer is grown on a GaAs substrate and a GaAs layer is grown on an Si substrate.

Figure 1:
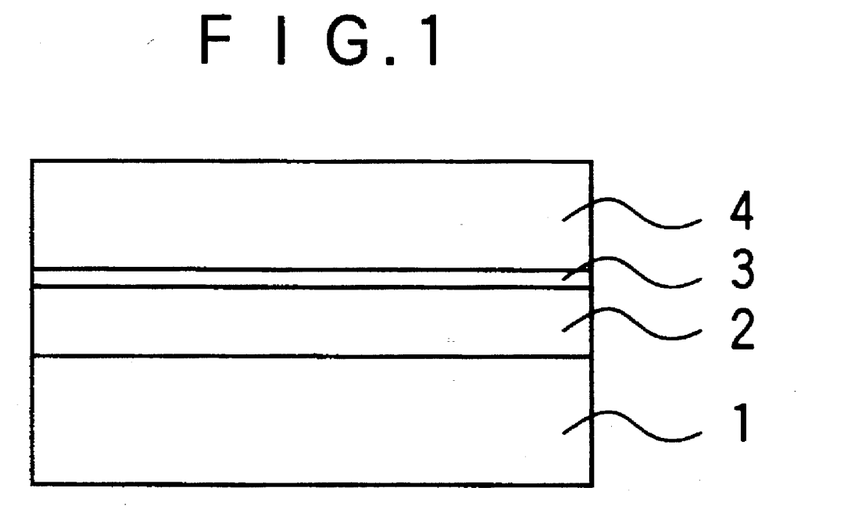
FIG. 1 is a sectional view for explaining a first embodiment of the present invention.

First, an example in which InGaAs is grown on GaAs will be described with reference to FIG. 1. A GaAs buffer layer 2 was grown on a GaAs wafer 1 by the known molecular beam epitaxy method, to form a single crystal substrate, and then a defect type compound layer 3 was grown. In this embodiment, a $Ga_2Se_3$ layer was used as the defect type compound 3, and its thickness was specified at about 1 nm. The lattice constant of $Ga_2Se_3$ is 0.543 nm, and the lattice mismatch between GaAs as a substrate and $Ga_2Se_3$ is 4%; however, when the thickness of $Ga_2Se_3$ is as small as 1 nm, $Ga_2Se_3$ is epitaxially grown while being strained. An InGaAs layer 4 was grown as a single crystal growth layer. The alloy ratio of the InGaAs layer 4, that is, the value of <x> in the chemical formula of $In_xGa_{1-x}As$ was specified at about 0.5. The lattice constant of InGaAs is 0.585 nm, and the lattice mismatch between GaAs as a substrate and InGaAs is 4%. The growth of these semiconductor layers may be made by a method using gas as a source material, for example, a metal-organic chemical vapor deposition method, other than the molecular beam epitaxy method.

Dislocations generated due to the lattice mismatch between the GaAs single crystal substrates 1, 2 and the InGaAs layer 4 are concentrated in the interior of the defect type compound layer 3, and thereby they are difficult to be generated in the upper InGaAs layer 4. Thus, the good InGaAs layer 4 with a small density of dislocations can be obtained.

Figure 2:
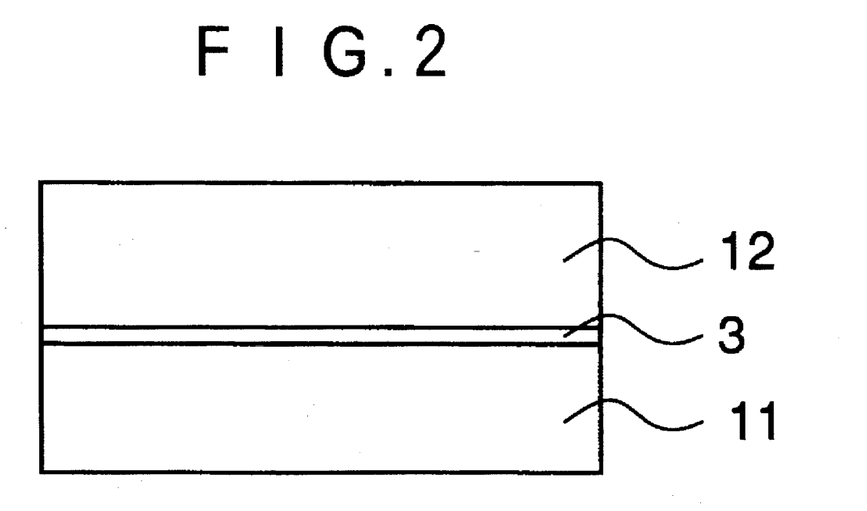
FIG. 2 is a sectional view for explaining the first embodiment of the present invention.

An example in which GaAs is grown on Si will be described with reference to FIG. 2. A $Ga_2Se_3$ layer 3 was formed as a defect type compound layer on an Si wafer 11 with surface being cleaned. The thickness of the $Ga_2Se_3$ layer 3 was specified at 1 nm. The lattice mismatch between Si wafer as the single crystal substrate and $Ga_2Se_3$ is as small as 0.5% or less. The $Ga_2Se_3$ layer having the thickness of 1 mm is epitaxially grown while being strained. As described above, the defect type compound layer 3 may be grown after formation of an Si buffer layer on the Si wafer. A GaAs layer 12 was grown as a single crystal growth layer on the defect type compound layer 3. Dislocation generated due to the lattice mismatch between Si of the wafer 11 and the GaAs layer 2 are concentrated in the interior of the defect type compound layer 3, and thereby they are difficult to be generated in the upper GaAs layer 12. Thus, the good GaAs layer 12 with a small density of dislocations can be obtained.

In this embodiment, there have been described the cases that InGaAs is grown on GaAs and GaAs is grown on Si; however, the same effect can be obtained for other cases that a semiconductor layer having a lattice constant different from that of a single crystal substrate to the extent of generating dislocations is epitaxially grown on the substrate, for example, the cases that a III–V compound semiconductor or a II–VI compound semiconductor having a lattice constant different from that of a substrate made of Si, GaAs or InP is layered as a single crystal layer on the substrate. As the defect type compound layer, there may be used compound layers other than $Ga_2Se_3$, for example $Ga_2S_3$ and $Ga_2Te_3$, and further, a mixture thereof. In the case of using the mixture, it becomes possible to change the alloy ratio so as to adjust the lattice constant in conformity with that of the single crystal substrate, thereby suppressing the generation of dislocations in the defect type compound layer during growth.

Moreover, in this embodiment, only one defect type compound layer is inserted; however, two or more defect type compound layers may be inserted to further reduce the density of dislocations. This example will be described with reference to FIG. 3, which is applied to the case that an InGaAs layer is grown on a GaAs substrate.

Figure 3:
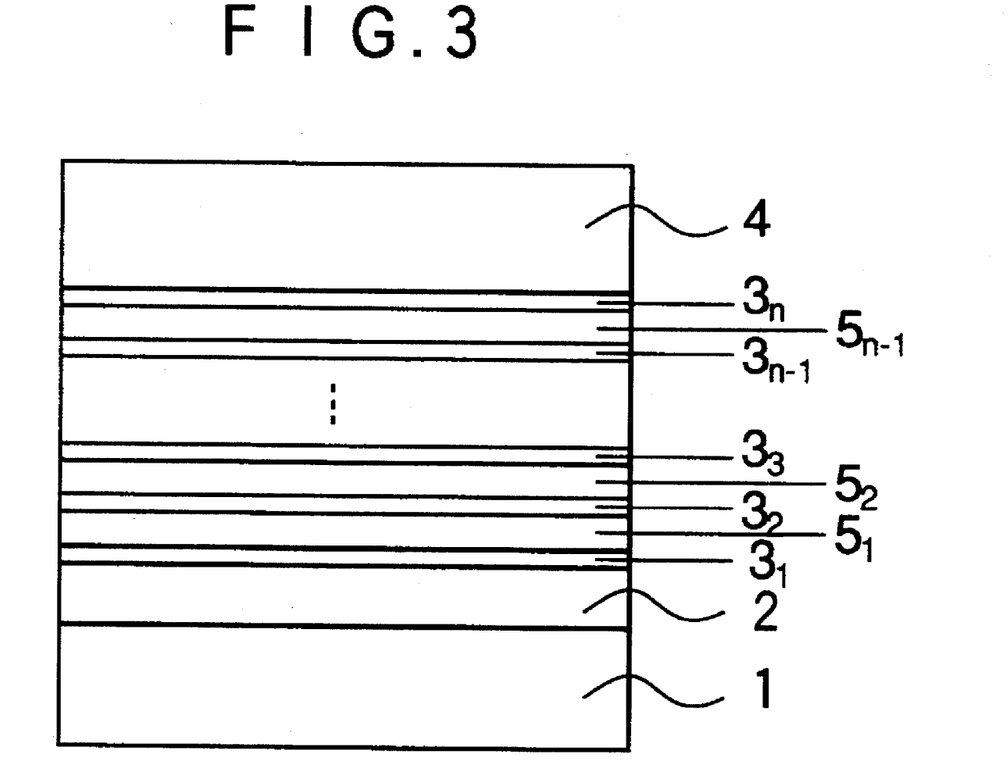
FIG. 3 is a sectional view for explaining the first embodiment of the present invention.

After a GaAs buffer layer 2 is grown on a GaAs wafer 1, each defect type compound layer $3_n$ (n=1 to n) and each InGaAs layer $5_n$ (n=1 to n-1) were alternately grown. Subsequently, an InGaAs layer 4 was grown on the uppermost defect type compound layer $3_n$. The alloy ratio of each of the InGaAs layers 4 and $5_n$ was specified at 0.5. The lattice mismatch between GaAs as the substrate and InGaAs is 4%. As the defect type compound layer $3_n$ (n=1 to n), there may be used $Ga_2Se_3$, $Ga_2S_3$, $Ga_2Te_3$ or a mixture thereof. When only one defect type compound layer is inserted, dislocations are, in some cases, not confined in the defect type compound layer and are generated in the InGaAs layer. However, the defect type compound layer has an effect not only to confine dislocations but also to shield the propagation of dislocations in the lower layer to the InGaAs layer grown on the upper side. Accordingly, by provision of the defect type compound layer not only between the substrate and the InGaAs layer but also on the upper side, it is possible to make furthermore smaller the density of dislocations in the InGaAs layer grown on the defect type compound layer. The thickness of each InGaAs layer provided at the intermediate portion may be thinner than a thickness to perfectly relax the strain. When the total thickness of the InGaAs layers are large, the relaxation is generated; however, most of the dislocations thus generated are confined in the lower defect type compound layer, and the remaining dislocations are shielded by the upper defect type compound layer, not to propagate to the upper InGaAs layer. Therefore, it is possible to reduce the dislocations in the uppermost InGaAs layer.

In the above examples, when the defect type compound layer is formed, the film is grown by supplying elements constituting the defect type compound layer. However, when the lower semiconductor layer contains elements constituting the defect type compound layer, remaining elements may be supplied as gases or molecular beams, to form the desired defect type compound layer on the surface by the reaction with the lower semiconductor. For example, a defect type compound layer of $Ga_2Se_3$ is formed on a GaAs substrate by irradiating Se molecular beams on the surface of the GaAs substrate while heating the substrate. Namely, by irradiating Se molecular beams, Se reacts with Ga atoms on the surface, to form a $Ga_2Se_3$ layer having a thickness of about 0.5 nm on the surface of GaAs.

In this case, excessive amount of As on the surface is released from the surface during irradiation of Se molecular beams. This makes it possible to form a thin defect type compound layer with a high controllability, and to simplify the forming process because of the utilization of the elements of the lower semiconductor.

<Embodiment 2>

In this embodiment, a semiconductor layered structure used for the case that GaAs is layered on an Si substrate is applied to a field effect transistor. This will be described with reference to FIGS. 4a to 4d.

The so-called high electron mobility transistor using a secondary electron gas induced at the interface between AlGaAs and GaAs as a channel is fabricated on an Si substrate.

Figure 4A:
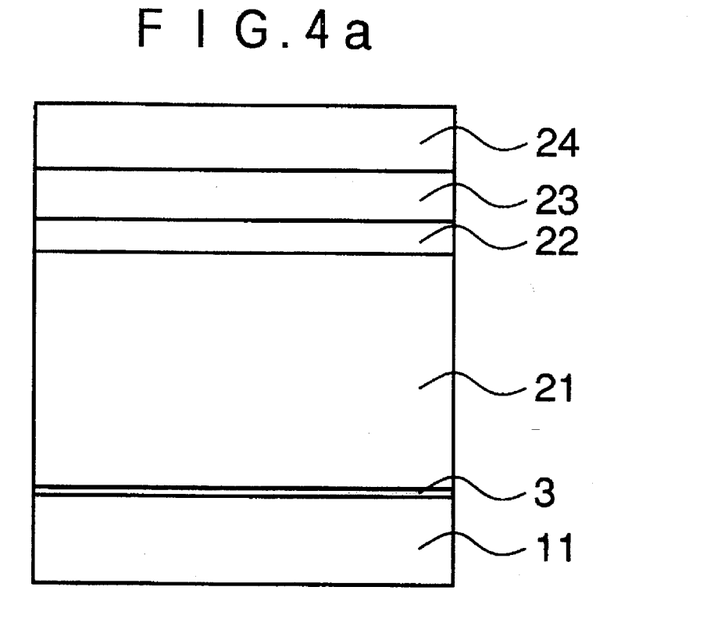
FIGS. 4a to 4d are process diagrams for explaining a second embodiment of the present invention.

First, as shown in FIG. 4a, a defect type compound layer 3 of $Ga_2Se_3$ having a thickness of 1 nm was formed on an Si wafer 11 as a single crystal substrate by molecular beam epitaxy. An undoped GaAs layer 21, an n-type AlGaAs layer 22 and an n+-type GaAs layer 23 were then sequentially grown, and further an $SiO_2$ film 24 was formed by chemical vapor deposition. The thickness of the undoped GaAs layer 21 was 1 µm; the thickness of the n-type AlGaAs layer 22 was 40 nm; and the thickness of n+-type GaAs. layer 23 was 200 nm.

The above undoped GaAs layer 21 is equivalent to the single crystal growth layer of the present invention. During growth of this layer, dislocations are generated in the defect type compound layer 3, to relax the strain, thus obtaining the good single crystal growth layer with no dislocation. Since any strain is not generated in the n-type AlGaAs layer 22 and n+-type GaAs layer 23 as the upper layers, any dislocation is not generated in these layers.

When the thickness of the undoped GaAs layer 21 is less than 1 µm and a strain is not perfectly relaxed, the three layers of the undoped GaAs layer 21, n-type AlGaAs layer 22 and n+-type GaAs layer 23 are regarded as the single crystal growth layers of the present invention. Even in this case, during formation of the n-type AlGaAs layer 22 and the n+-type GaAs layer 23 as the upper layers, dislocations are generated in the defect type compound layer 3, thereby causing the relaxation of the strain.

Figure 4B:
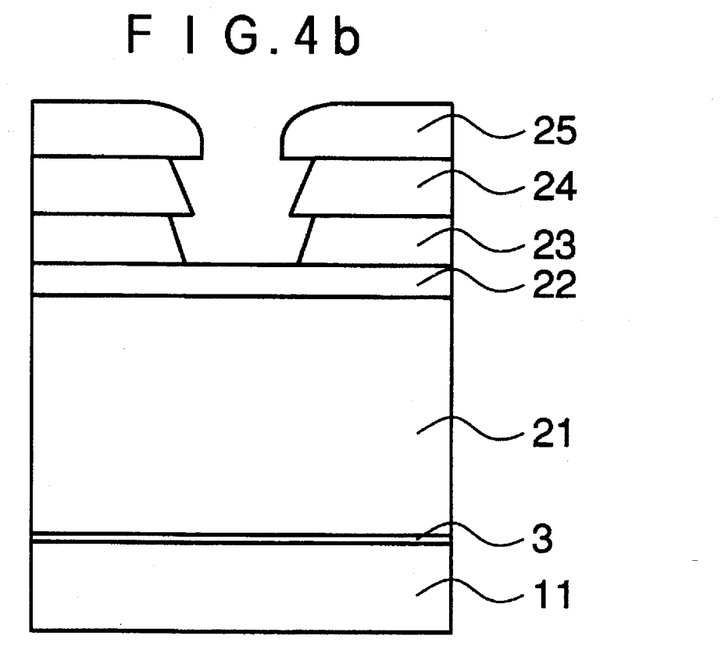

Next, as shown in FIG. 4b, after a resist film 25 having a pattern of a gate opening portion was formed, the $SiO_2$ film 24 exposed through the opening was removed by dry etching. Moreover, the exposed portion of the n+-type GaAs layer 23 was removed by etching, thus forming a recess structure composed of the n+-type GaAs layer 23 as a cap layer.

Figure 4C:
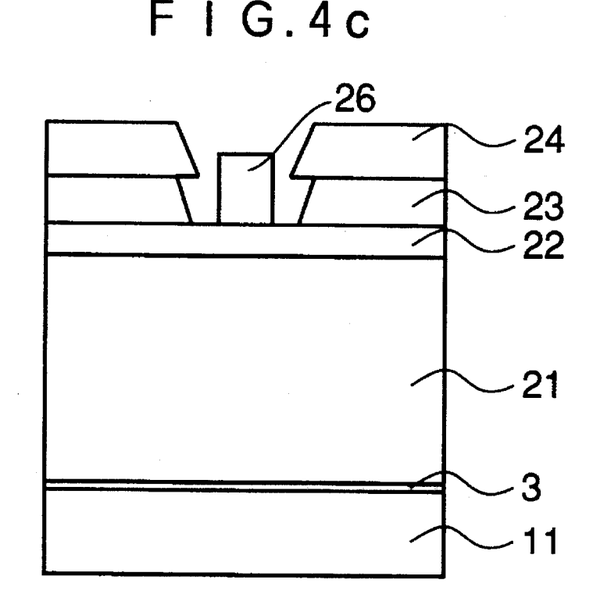

A metal film composed of two layers of Ti and Al was formed on the surface, and the metal film formed on the resist film 25 was removed together with the resist film 25, thus forming a gate electrode 26 as shown in FIG. 4c.

Figure 4D:
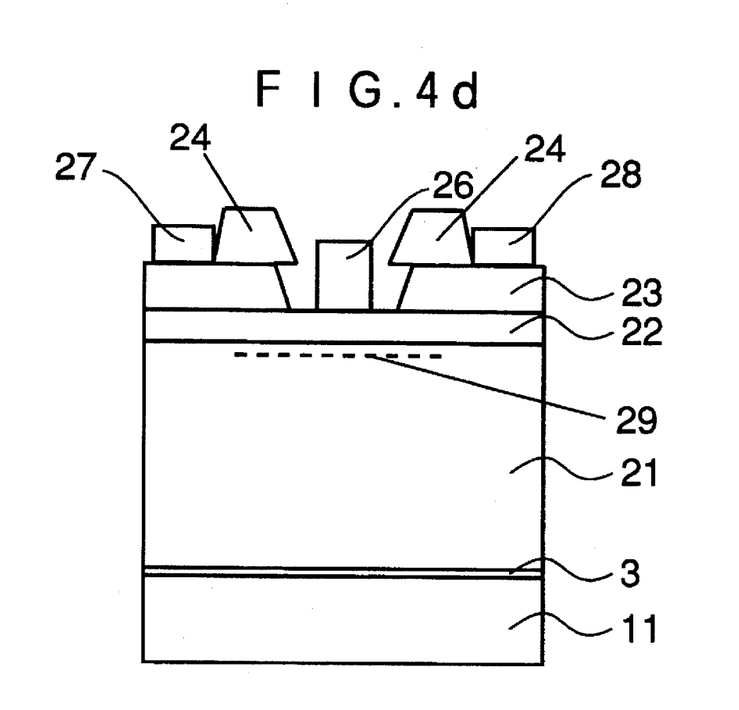

Finally, as shown in FIG. 4d, a source electrode 27 and a drain electrode 28, which are made of AuGe, are formed on the above n+-type GaAs layer 23, thus forming a field effect transistor. The length of the gate electrode 26 was 0.3 µm.

In the transistor of this embodiment, the gate electrode 26 is contacted with the n-type AlGaAs layer 22; and the carrier concentration of the channel composed of a two-dimensional electron gas 29 induced at the interface between the n-type AlGaAs layer 22 and the undoped GaAs layer 21 is adjusted by the bias applied to the gate electrode 26, to control the current flowing between the source and drain electrodes, thus obtaining the action of the transistor.

When the $Ga_2Se_3$ layer 3 is not inserted between the Si wafer 11 and the undoped GaAs layer 21, dislocations generated at the interface between the Si substrate 11 and the undoped GaAs layer 21 easily reach the vicinity of the channel, to reduce the mobility and the concentration of electrons, thereby failing to obtain a good performance.

On the contrary, by insertion of the $Ga_2Se_3$ layer 3 according to this embodiment, there can be obtained the transistor having characteristics being substantially the same as those of the transistor fabricated by layering of a compound semiconductor layer on a GaAs wafer. The transconductance of the transistor of this embodiment was about 200 mS/mm.

In this embodiment, there has been described the transistor using the secondary electron gas induced at the interface between AlGaAs and GaAs as the channel. However, the same effect can be obtained for a transistor having the structure in which impurities are doped at the channel portion. Moreover, the same effect can be obtained by the insertion of the $Ga_2Se_3$ layer, for a field effect transistor, in which InGaAs having an alloy ratio being as large as about 0.5 is used as the semiconductor constituting the channel of the transistor, and GaAs is used as a substrate.

<Embodiment 3>

In this embodiment, the present invention is applied to a compound semiconductor heterojunction bipolar transistor. This will be described with reference to FIGS. 5a to 5d.

Figure 5A:
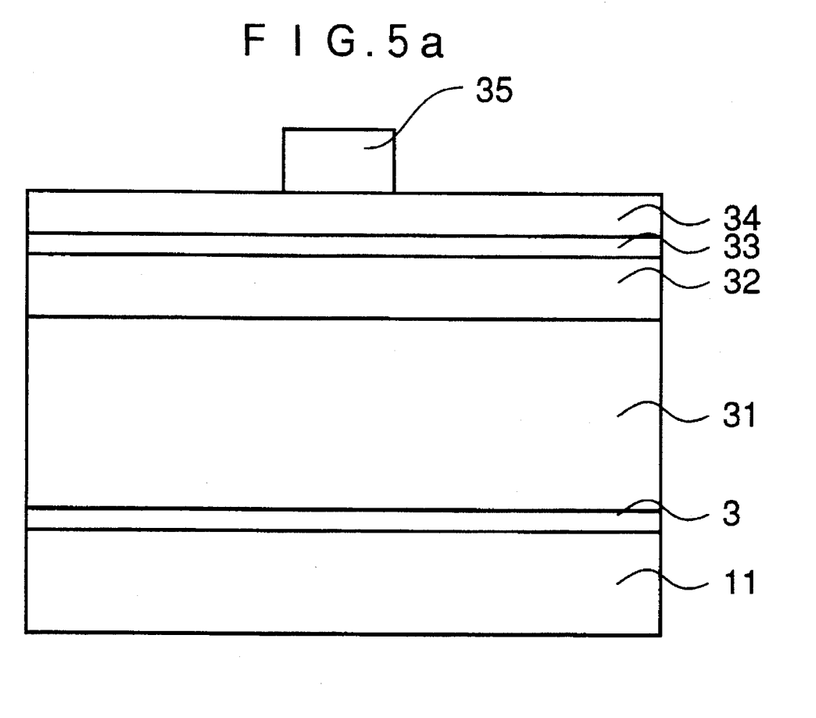
FIGS. 5a to 5d are process diagrams for explaining a third embodiment of the present invention.

As shown in FIG. 5a, a defect type compound layer 3, an undoped GaAs layer 31, an n-type GaAs collector layer 32, a p-type GaAs base layer 33, and an emitter layer 34 of two layers of n-type AlGaAs and n-type InGaAs were sequentially formed on an Si wafer 11 by molecular beam epitaxy. An emitter electrode 35 was then formed. The thickness of the undoped GaAs layer 31 was 1 μm; the thickness of the collector layer 32 was 200 nm; and the thickness of the base layer 33 was 30 nm. Moreover, a $Ga_2Se_3$ layer having a thickness of 1 nm was formed as the defect type compound layer 3.

The above undoped GaAs layer 31 is equivalent to the single crystal growth layer of the present invention. During growth of this layer, dislocations are generated in the defect type compound layer 3, to relax the strain, thus obtaining the good single crystal growth layer with no dislocation. Since any strain is not generated in the collector layer 32 and the base layer 33 as the upper layers, any dislocation is not generated in these layers. When the InGaAs layer contained in the emitter layer 34 is thick, dislocations are generated in this InGaAs layer due to the lattice mismatch with GaAs; however, any dislocation is not generated in the lower semiconductors, with no problem.

When the thickness of the undoped GaAs layer 31 is less than 1 μm and the strain is not perfectly relaxed, the four layers of the undoped GaAs layer 31, collector layer 32, base layer 33 and the lower n-type AlGaAs layer of the emitter layer are regarded as the single crystal growth layer. In this case, when the collector layer 32, base layer 33 and the lower n-type AlGaAs layer of the emitter layer are formed, dislocations are generated in the defect type compound layer, thus causing the relaxation of the strain.

Figure 5B:
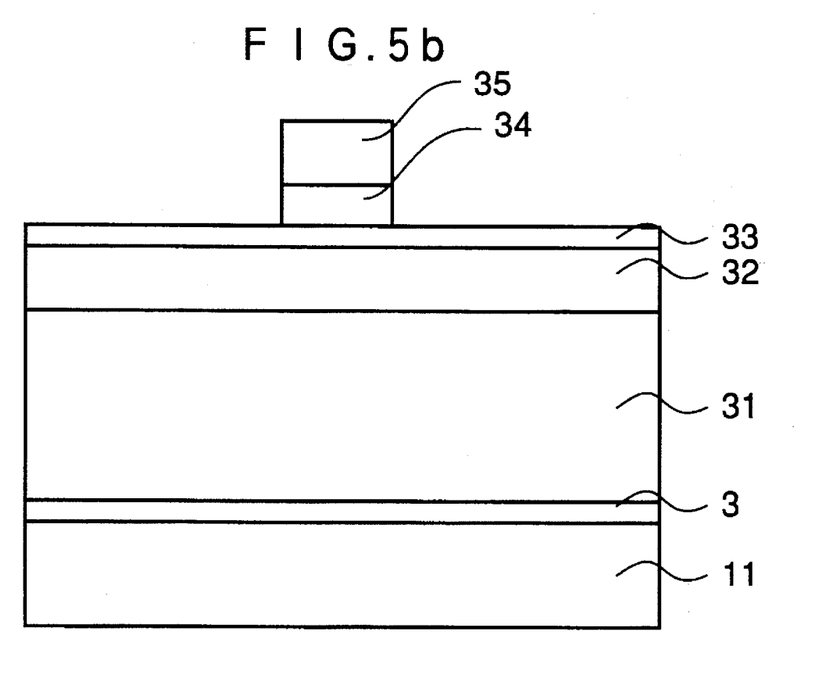

As shown in FIG. 5b, the exposed portion of the emitter layer 34 was removed by chemical etching using the emitter electrode 35 as a mask.

Figure 5C:
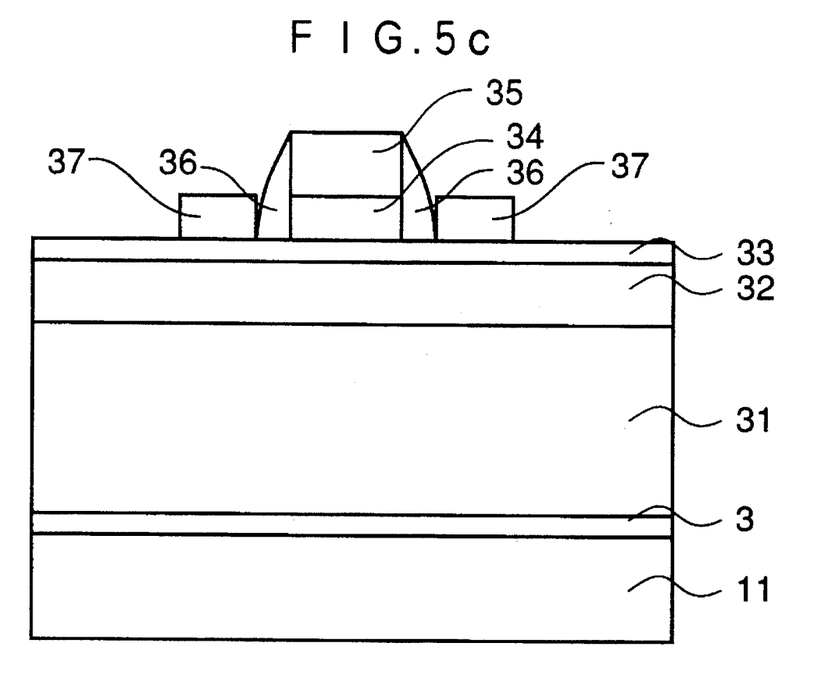

Subsequently, as shown in FIG. 5c, side walls 36 made of an insulator were formed on the side surfaces of the emitter electrode 35 and the emitter layer 34 using the known overall formation of the insulator film and overall anisotropic etching, and a base electrode 37 was then formed.

Figure 5D:
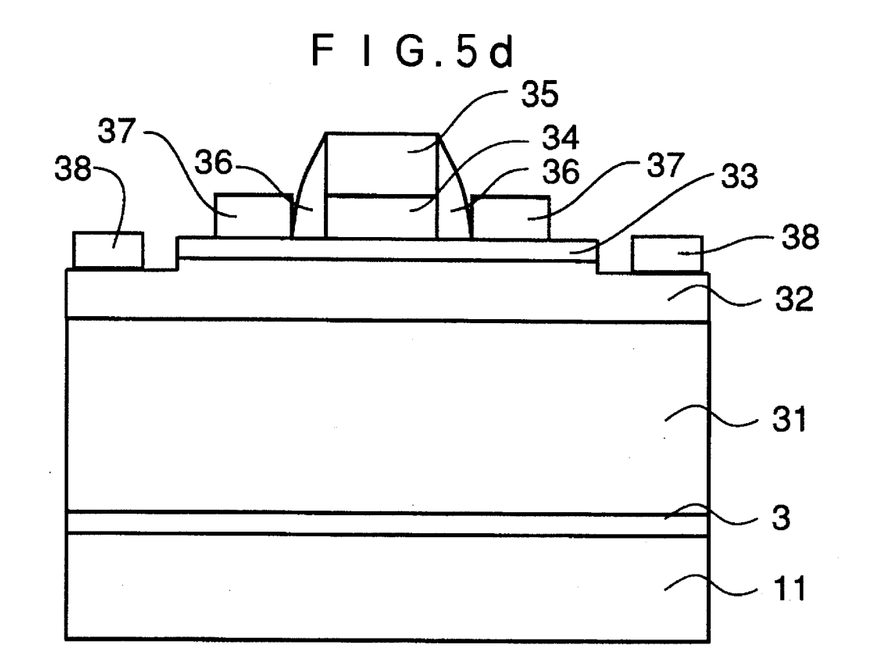

Finally, as shown in FIG. 5d, the collector layer 32 was exposed by removal of the part of base layer 33, to form a collector electrode 38, thus completing the bipolar transistor.

When the $Ga_2Se_3$ layer 3 is not inserted between the Si wafer 11 and the undoped GaAs layer 31, dislocations generated at the interface between the Si wafer 11 and the undoped GaAs layer 31 reach the vicinity of the base layer 33, and minority carriers (in this case, electrons) diffused and injected from the emitter layer 34 to the base layer 33 are recombined with positive holes by way of a defect state associated with the dislocations, the transistor characteristics such as a current gain are deteriorated. On the contrary, by insertion of the $Ga_2Se_3$ layer 3 between the Si wafer 11 and the undoped GaAs layer 31 according to this embodiment, there can be obtained the transistor having the characteristics being substantially the same as those of the transistor fabricated on a GaAs wafer.

In this embodiment, the field effect transistor or bipolar transistor is fabricated using a single crystal growth layer grown on a substrate; however, the present invention may be applied to the fabrication of a light emitting element such as a laser or a light receiving element. In this case, a good optical element without deterioration in the carrier life due to dislocations can be obtained.

<Embodiment 4>

In the above-described embodiments 2 and 3, a device is fabricated near the surface of a semiconductor layer grown on a substrate. On the contrary, in this embodiment, a defect type compound layer is formed in an active region of a device.

Figure 6:
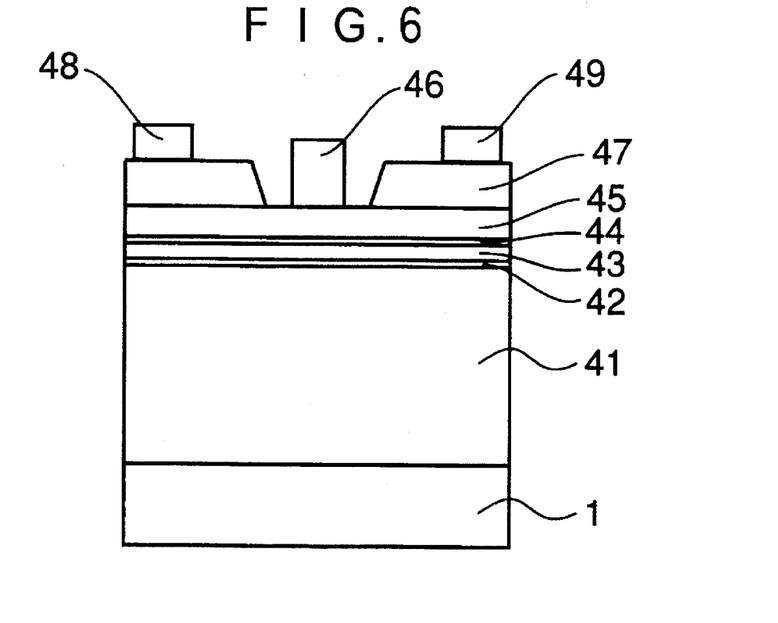
FIG. 6 is a sectional view for explaining a fourth embodiment of the present invention.

FIG. 6 is a sectional view of a field effect transistor according to this embodiment. In FIG. 6, numeral 1 designates a GaAs wafer; 41 is an undoped GaAs layer; 42 and 44 are defect type compound layers; 43 is an undoped InGaAs layer; 45 is an n-type AlGaAs layer; 47 is an n+-type GaAs layer; 46 is a gate electrode; 48 is a source electrode; and 49 is a drain electrode.

The formation of the semiconductor layers and electrodes were performed in the same manner as in Embodiment 2. The n+-type GaAs layer was a cap layer having a recess structure. The gate length was 0.3 μm, the thickness of the n-type AlGaAs layer 45 was 50 nm, and the thickness of the undoped InGaAs layer 43 was 10 nm. The alloy ratio <x> of ($In_xGa_{1-x}As$) of the undoped InGaAs layer 43 was 0.5.

The defect type compound layers 42 and 44 were formed as follows. The undoped GaAs layer 41 was grown, and then the surface of the layer 41 was irradiated with Se molecular beams to form the defect type compound layer 42 of $Ga_2Se_3$ having a thickness of about 0.5 nm. The undoped InGaAs layer 43 was grown on the layer 42, and the surface of the layer 43 was irradiated with Se molecular beams again to form the defect type compound layer 44 of $Ga_2Se_3$, or of a mixture of selenides of Ga and In.

In the transistor of this embodiment, a secondary electron gas induced in the undoped InGaAs layer 43 is used as a conducting channel. By increasing the indium content in the undoped InGaAs layer 43, it is possible to make larger the mobility and the concentration of the conducting electrons, and hence to improve the performance of the transistor. However, when the defect type compound layer is not inserted, the excessively large content of indium in the undoped InGaAs layer as the single crystal grown layer excessively increase the mismatch of the lattice constant with that of GaAs as the single crystal substrate, to generate dislocations in the interior of the undoped InGaAs layer, thus reducing the mobility and the concentration; accordingly, when the thickness of the InGaAs layer is 10 nm, the alloy ratio <x> of ($In_xGa_{1-x}As$) is required to be less than 0.3.

On the other hand, in this embodiment, during growth of the InGaAs layer 43, dislocations are generated in the defect type compound layer 42 to relax the strain, so that even when the undoped InGaAs layer 43 having a large alloy ratio of 0.5 is grown, any dislocation is not generated in the layer 43, thus obtaining a channel having the large mobility and concentration of electrons. Moreover, since the strain is relaxed by the defect type compound layers, it is possible to eliminate a problem that the band structure of the InGaAs layer as the channel is changed by the strain, and thereby the mobility is reduced.

In this embodiment, the two defect type compound layers 42 and 44 were inserted while putting the InGaAs layer 43 therebetween. As described above, the layer 42 has an effect to confine dislocations generated during growth of the InGaAs layer 43. The layer 44 has an effect to confine dislocations generated during growth of the n-type AlGaAs layer 45, and an effect to shield the propagation of dislocations generated at the lower layer to the upper layer.

<Embodiment 5>

Figure 7:
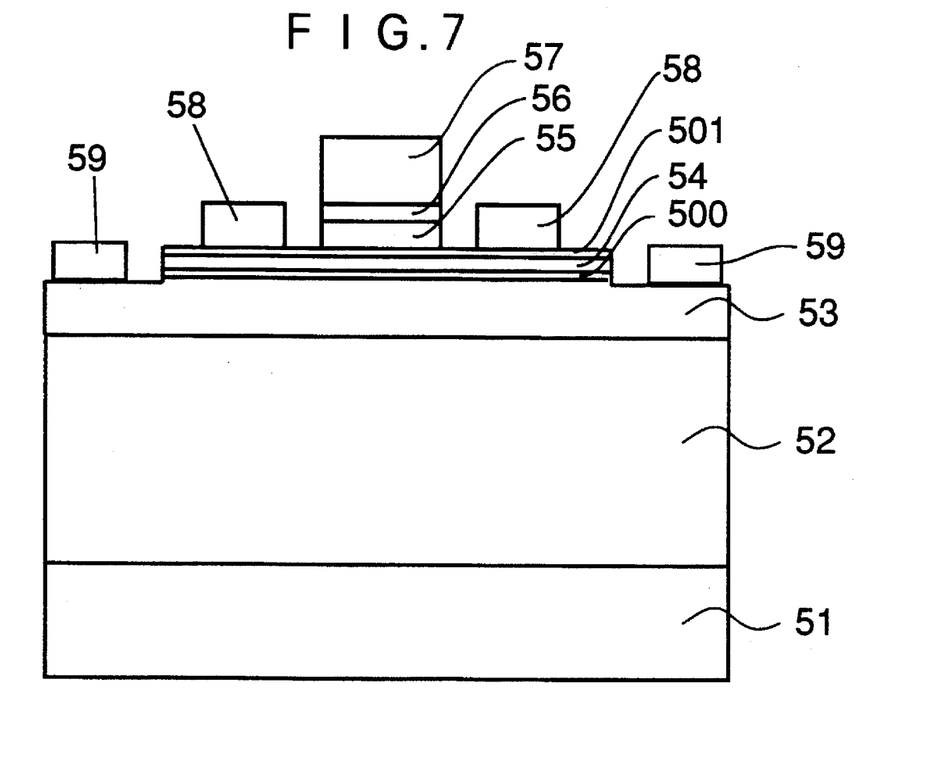
FIG. 7 is a sectional view for explaining a fifth embodiment of the present invention.

In this embodiment, a defect type compound layer is provided in an active area of a heterojunction bipolar transistor. This will be described with reference to FIG. 7. In FIG. 7, numeral 51 designates an InP wafer; 52 is an undoped InP layer; 53 is an n-type InGaAs layer; 54 is a p-type InGaAs layer; 500 and 501 are defect type compound layers; 55 is an n-type InAlAs layer; 56 is an n-type InGaAs layer; 57 is an emitter electrode; 58 is a base electrode; and 59 is a base electrode. The n-type InGaAs layer 53 serves as a collector layer; the p-type InGaAs layer serves as a base layer; and the n-type InAlAs layer 55 serves as an emitter layer.

The fabrication was made in the same manner as in Embodiment 3. The alloy ratio $<y>$ of $(In_yGa_{1-y}As)$ of the n-type InGaAs layers 53 and 56 was 0.53, and the alloy ratio $<Z>$ of $(In_zAl_{1-z}As)$ of the n-type InAlAs layer 55 was also 0.53. The alloy ratio $<x>$ of $(In_xGa_{1-x}As)$ of the p-type InGaAs layer 54 was 0.8. The defect type compound layers 500 and 501 were formed by the steps of forming the n-type InGaAs layer 53 and irradiating Se molecular beams on the surface of the layer 53; and forming the p-type InGaAs layer 54 thereon and irradiating Se molecular beams on the surface of the layer 54. Thus, the defect type compound layers 500 and 501, each having a thickness of 0.5 nm and being composed of $Ga_2Se_3$ or a mixture of selenides of Ga and In, were formed while putting the p-type InGaAs layer 54 therebetween.

The defect type compound layer 500 has an effect to confine dislocations generated during growth of the InGaAs layer 54. The defect type compound layer 501 has an effect to confine dislocations generated during growth of the n-type InAlAs layer 55, and an effect to shield the propagation of dislocations generated in the lower layer to the upper layer.

In the bipolar transistor which uses minority carriers, it is required to suppress defects such as dislocations in the base layer to the utmost, and to prevent the re-combination of the minority carriers. For this reason, it is important to adjust the alloy ratio of the layered semiconductor layer, and to match the lattice constant of the semiconductor layer with that of the substrate. In the bipolar transistor, the alloy ratio of $In_xGa_{1-x}As$ has been set at 0.53, to match the lattice constant of InGaAs with that of the InP substrate. However, in this embodiment, by insertion of the defect type compound layers 500 and 501, even when the alloy ratio $<x>$ of the InGaAs layer 54 as the base layer is set at a large value of 0.8, any dislocation is not generated in the layer. The alloy ratio $<x>$ of the InGaAs layer may be more than 0.8, or in the range from 0.8 to 1.0.

Thus, the mobility and the concentration of electrons in the base layer are increased, and the difference in the band gap with the emitter layer, so that it becomes possible to increase the current gain of the transistor. The contact resistance between the base electrode and the p-type InGaAs layer 54 is also decreased, and thus the base resistance can be reduced.

Even in fabricating the device in which the alloy ratio of the P-type InGaAs layer is 0.53, the actual alloy ratio is varied depending on the variation of the growth process, which tends to cause failures. However, in this embodiment, by insertion of the defect type compound layers, it is possible to effectively suppress the effect of the variation in the alloy ratio on the characteristics of the device.

In Embodiments 4 and 5, the defect type compound layer is inserted in the interior of the electron device; however, it may be inserted in the interior of an optical device. For example, a long wave length semiconductor laser is formed using a semiconductor with a small band gap such as InGaAsP or InGaAs as an active layer for generating the light by the re-combination of carriers and a guide layer for confining a light. In general, the semiconductor with a small band gap tends to have larger lattice constant. As a result, the mismatch of the lattice constant between the active layer or guide layer and the semiconductor substrate on which the layer is grown is increased, to generate dislocations, thus reducing the emission efficiency and the life of the device. For this reason, the semiconductor layered structure used for the conventional laser has been limited to the lattice match system. However, by insertion of the defect type compound layer between the semiconductor substrate and the guide layer or the active layer, the dislocations generated during relaxation of the strain are confined in the defect type compound layer, thus obtaining a good laser, even when it has the lattice mismatch.

<Embodiment 6>

Figure 8:
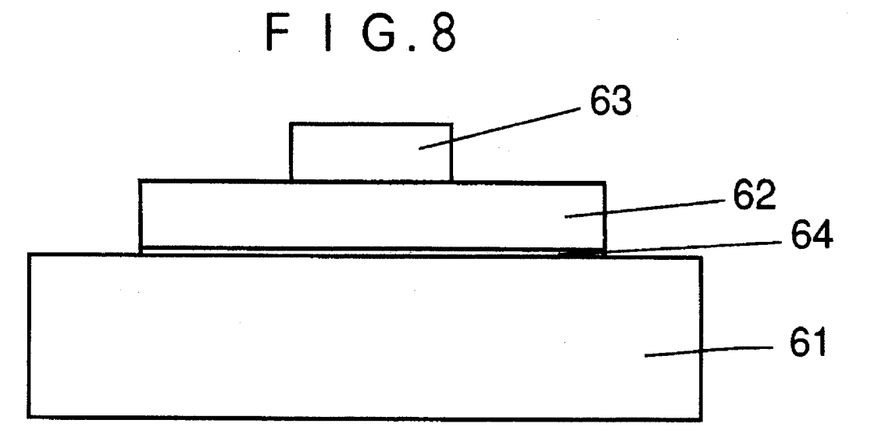
FIG. 8 is a sectional view for explaining a sixth embodiment of the present invention.
Figure 9:
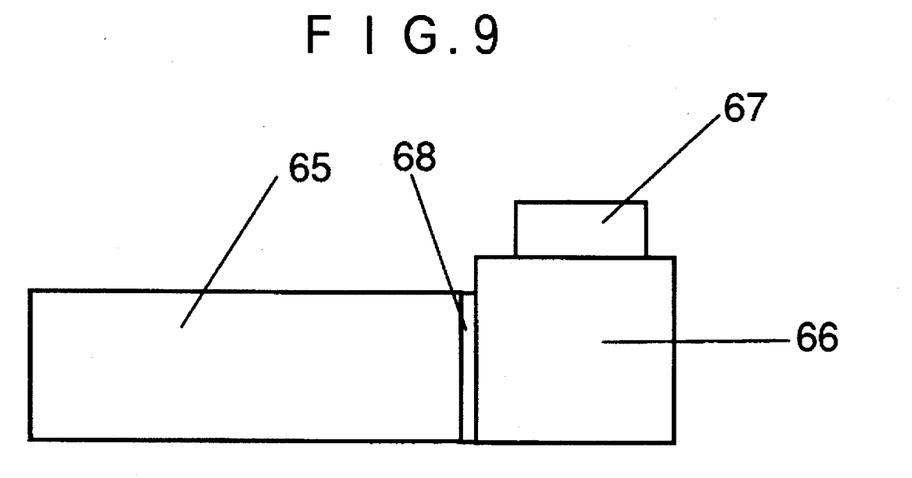
FIG. 9 is a sectional view for explaining the sixth embodiment of the present invention.

In this embodiment, the present invention is applied to an ohmic electrode structure. First, the basic semiconductor layered structure will be described with reference to FIGS. 8 and 9. In FIGS. 8 and 9, numerals 61 and 65 designate n-type GaAs areas; 62 and 66 are n-type InGaAs areas; 63 and 67 are electrodes; and 64 and 68 are defect type compound layers. In FIG. 8, the n-type InGaAs area is provided over the n-type semiconductor area; while in FIG. 9, the n-type InGaAs area is provided on the side portion of the n-type semiconductor area. In FIG. 9, the side contact is formed of the semiconductor layered structure on the side portion.

The conduction band minimum of InGaAs is smaller than that of GaAs; accordingly, by insertion of the n-type InGaAs area 62 or 66, the electron energy at the conduction band minimum between the n-type GaAs and the electrode can be stepwise changed. This makes it possible to improve the ohmic contact between the n-type semiconductor area 61 or 65 and the electrode 63 or 67.

Thus, in formation of the ohmic contact in the first semiconductor area, when the first semiconductor is of an n-type, by provision of the n-type second semiconductor area having an electron energy at the minimum of the conduction band which is smaller than that of the first semiconductor area between the electrode and the first semiconductor area, it is possible to make small the contact resistance. On the other hand, when the fist semiconductor area is of a p-type, the p-type second semiconductor area having an electron energy at the maximum of the valence band which is larger than that of the first semiconductor area may be provided between the electrode and the first semiconductor area. However, since the lattice constant of the second semiconductor area having the above property is larger than that of the first semiconductor area is most causes, a lattice mismatch is generated between the first semiconductor area and the second semiconductor area. However, by insertion of the defect type compound layer between the first semiconductor area and the second semiconductor area according to this embodiment, it is possible to confine dislocations generated during growth of the second semiconductor area in the defect type compound layer. Accordingly, there can be obtained the small resistance second semiconductor area without dislocation, that is, there can be obtained a good ohmic contact with a small contact resistance to the first semiconductor area.

Figure 10A:
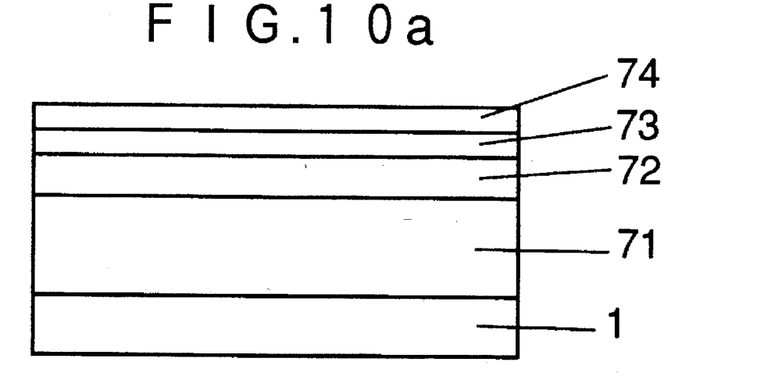
FIGS. 10a to 10c are process diagrams for explaining the sixth embodiment of the present invention.
Figure 10B:
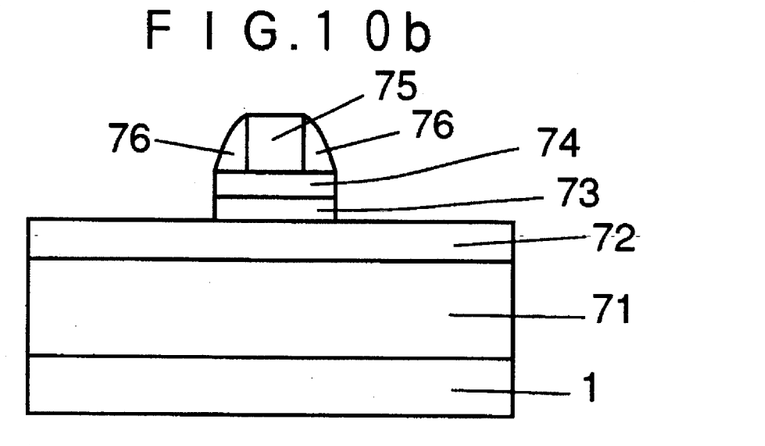
Figure 10C:
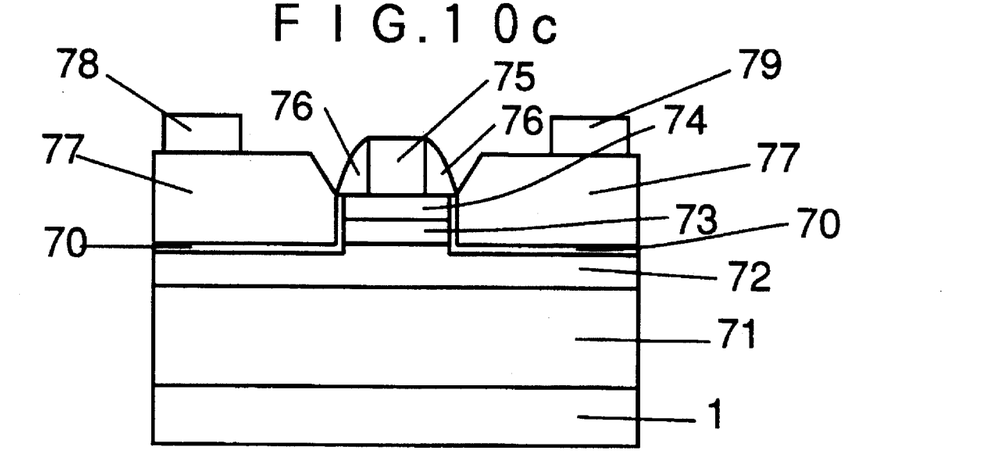

FIGS. 10a to 10c are process diagram showing an example in which the ohmic electrode structure of the present invention is applied to an electrode structure of a semiconductor device (field effect transistor).

First, as shown in FIG. 10a, an undoped GaAs layer 71, a p-type GaAs layer 72, an n-type InGaAs layer 73 and an undoped AlGaAs layer 74 were sequentially formed on a GaAs wafer 1 by a crystal growth technique such as molecular beam epitaxy. The thickness of the n-type InGaAs layer 73 was 15 nm. The alloy ratio <x> of $In_xGa_{1-x}As$ was 0.1. For this alloy ratio, the lattice mismatch between InGaAs and GaAs is as small as 1% or less, and any dislocation is not generated in the InGaAs layer. Accordingly, this layer is out of the present invention. The thickness of the undoped AlGaAs layer 74 was 15 nm.

Next, as shown in FIG. 10b, a gate electrode 75 made of tungsten silicide and side walls 76 made of $SiO_2$ were formed on the surface by the known film deposition method and lithography technique, and the undoped AlGaAs layer 74 and the n-type InGaAs layer 73 were removed by etching using the gate electrode 75 and the side walls 76 as a mask. The gate length was 0.3 μm, and the width of the side wall 76 was 0.1 μm.

The surface was cleaned using hydrogen radicals, and was irradiated with Se molecular beams, to thus form a defect type compound layer 70. The surface may be exposed to a hydrogen selenide gas, in place of the irradiation of Se molecular beams. In each case, the defect type compound layer 70 composed of a selenide of gallium, indium and aluminum was formed. The thickness of the layer 70 was about 0.5 nm.

An n-type InGaAs layer 77 was then selectively grown on the above defect type compound layer 70 by the epitaxy using organometallic gas. The alloy ratio <x> of the n-type InGaAs layer 77 was 0.1 at the interface, and was about 0.8 at the surface, and it was continuously or stepwise changed between the interface and the surface. Finally, a source electrode 78 and a drain electrode 79 were formed, thus completing a field effect transistor shown in FIG. 10c. The source electrode and drain electrode were made of a multilayer film of Ti/Pt/Au; however, they may be made of the other material such as AuGe.

In the example shown in FIG. 10, the p-type GaAs layer 72, n-type InGaAs layer 73 and undoped AlGaAs layer 74 are considered as the single crystal substrates, and the n-type InGaAs layer 77 is considered as a single crystal growth layer of the present invention. The n-type InGaAs layer 77 forms the side contact to the channel constituted of the n-type InGaAs layer 73.

The channel constituted of the n-type InGaAs layer 73 is brought in the ohmic contact with the source electrode 78 and the drain electrode 79 by way of the n-type InGaAs layer 77 with the varied composition. By sufficiently increasing the alloy ratio of InAs on the n-type InGaAs layer 77, it is possible to obtain the ohmic contact even for the usual Schottky junction with no alloying.

On the surface of the n-type InGaAs layer 77, the alloy ratio is 0.8 and the lattice constant is as large as 0.598 mm, so that the lattice mismatch with GaAs of the substrate becomes as large as 6% and also the lattice mismatch with InGaAs of the channel (alloy ratio: 0.1) becomes as large as 5%. Accordingly, when the defect type compound layer 70 is not inserted, during growth of the n-type InGaAs layer 77, dislocations are generated in the n-type InGaAs layer 77, and thus, the resistance in the layer is increased. However, in this embodiment, the defect type compound layer 70 is inserted, to reduce the density of dislocations, thus obtaining the electrode with a small contact resistance. This makes it possible to obtain a good transistor with a small parasitic resistance. The transistor of this embodiment showed a large transconductance of 400 mS/mm.

In the example shown in FIG. 10, the alloy ratio of the n-type InGaAs layer 73 as the channel layer is made as small as 0.1, so that any dislocation is not generated in this layer. However, as described in Embodiment 4, by insertion of the defect type compound layers on the upper and lower sides of the channel layer, the alloy ratio may be increased to be more than 0.1. Thus, the defect type compound layer may be used for the channel portion and the ohmic contact portion.

FIGS. 11a to 11d show an example in which the electrode structure of the present invention is applied to a heterojunction bipolar transistor.

Figure 11A:
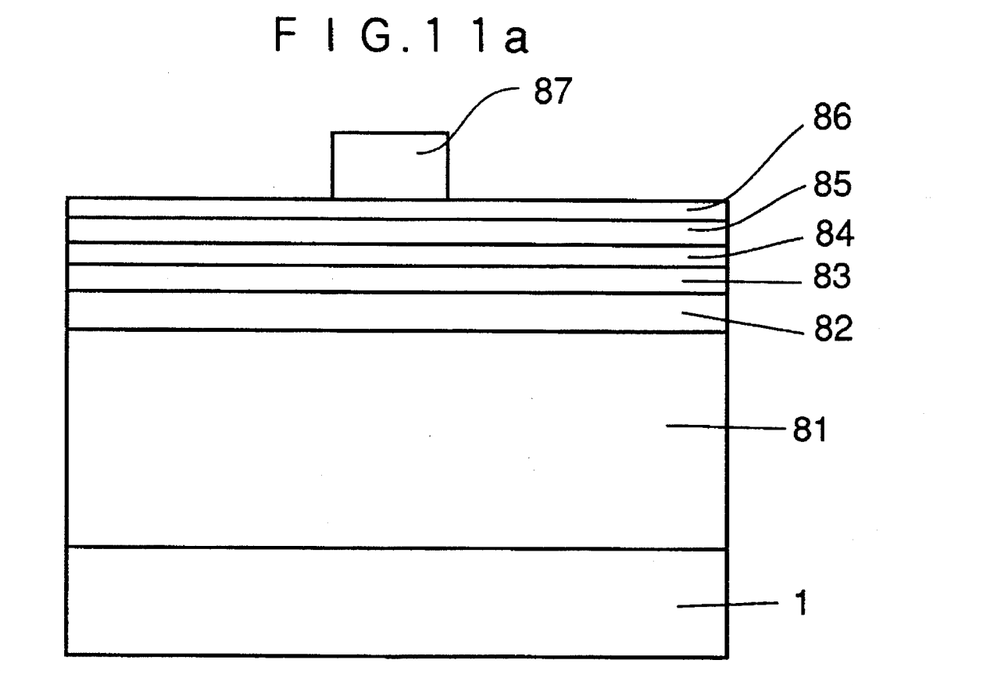
FIGS. 11a to 11d are process diagrams for explaining the sixth embodiment of the present invention.

As shown in FIG. 11a, an undoped GaAs layer 81, an n-type GaAs layer 82, an $n^-$-type GaAs layer 83, a p-type GaAs layer 84, an n-type AlGaAs layer 85 and an n-type InGaAs layer 86 were sequentially grown on a GaAs wafer 1 by the molecular beam epitaxy method or a crystal growth method using organometallic gas. An emitter electrode 87 was then formed. The alloy ratio of the n-type InGaAs layer 86 was made as small as 0.1, and thereby any dislocation was not generated in this layer. Therefore, this layer is out of the present invention.

Figure 11B:
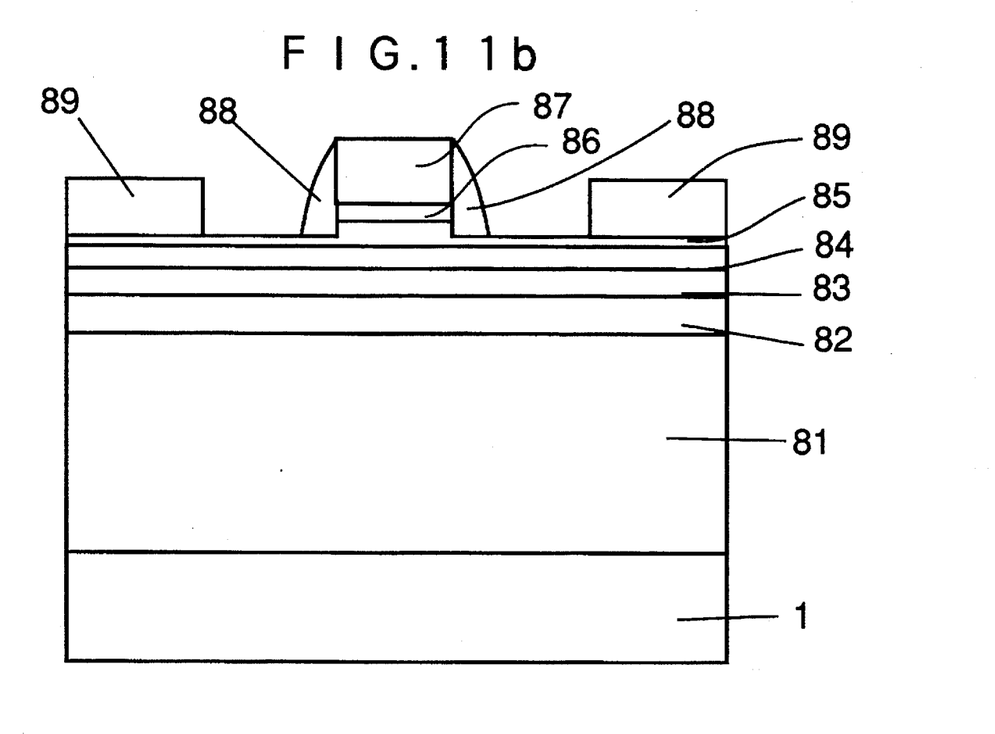

As shown in FIG. 11b, the exposed portions of the n-type InGaAs layer 86 and the n-type AlGaAs layer 85 were sequentially removed by etching using the emitter electrode 87 as a mask. The etching was stopped while remaining part of the exposed portion of the layer 85. An opening pattern 89 and of side walls 88, bath of which are made of insulator are then formed.

Figure 11C:
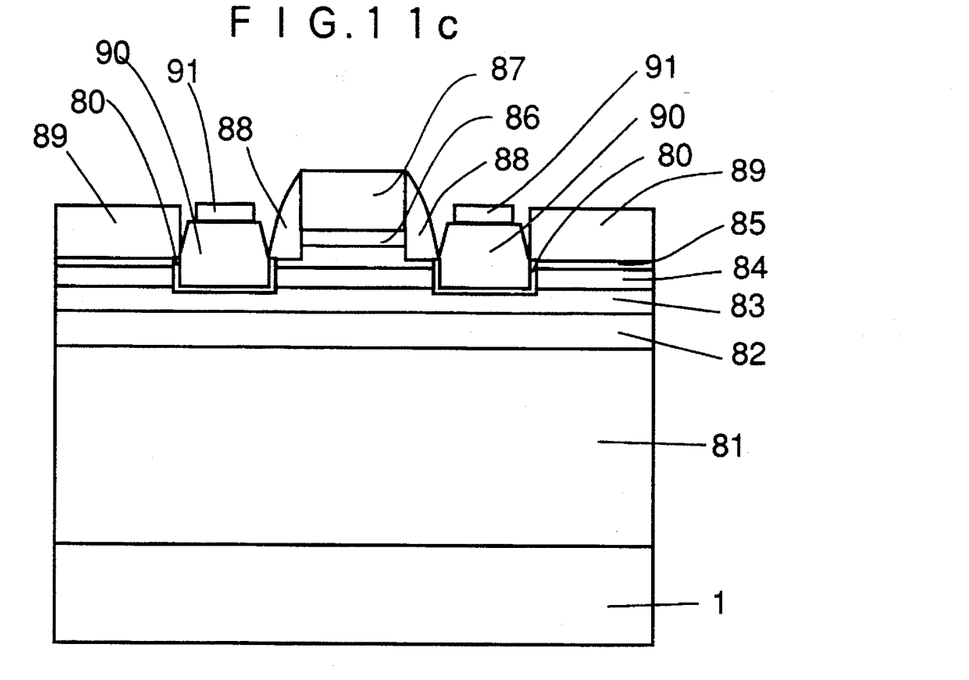

As shown in FIG. 11c, the exposed portions of the n-type AlGaAs layer 85 and the p-type GaAs layer 84 were etched using the emitter electrode 87, side walls 88 and the opening pattern 89 as masks. The surface was then cleaned using hydrogen radicals, and was irradiated with Se molecular beams, to thus form a defect type compound layer 80. The surface may be exposed to a hydrogen selenide gas in place of irradiation of Se molecular beams. In each case, the defect type compound layer 80 made of a selenide of gallium and aluminum was formed on the surface. The thickness of the defect type compound layer 80 was about 0.5 nm.

A p-type InGaAs layer 90 was then selectively grown on the defect type compound layer 80 using the emitter electrode 87, side walls 88 and the opening pattern 89 as masks. The alloy ratio of the p-type InGaAs layer 90 was 0.1 at the interface and was about 0.8 at the surface, and it was continuously or stepwise changed between the interface and the surface. In this example, the n-type GaAs layer 83, p-type GaAs layer 84 and n-type AlGaAs layer 85 are considered as the single crystal substrate and the p-type InGaAs layer 90 is considered as the single crystal growth layer of the present invention.

Figure 11D:
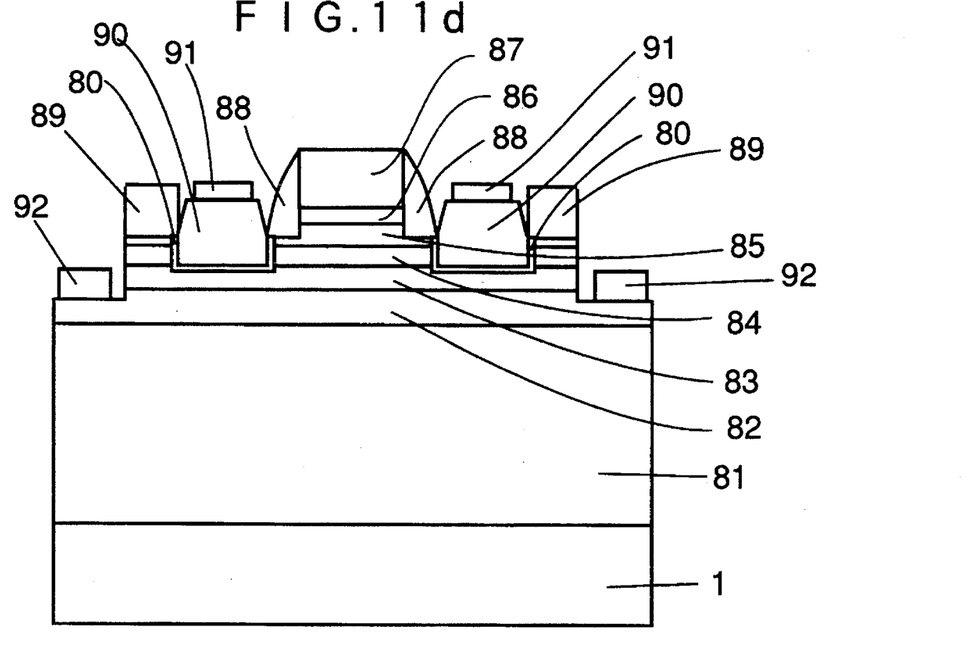

A base electrode 91 was formed on the surface of the p-type InGaAs layer 90, and then the n-type GaAs layer 82 was exposed by etching a collector electrode area, after which, a collector electrode 92 was formed, thus forming a transistor having the structure shown in FIG. 11d.

In this embodiment, the p-type GaAs layer 84 as the base layer is brought in the ohmic contact with the base electrode 91 by way of the p-type InGaAs layer 90 with the varied composition. On the surface of the p-type InGaAs layer 80, the alloy ratio is 0.8 at the surface, and the lattice constant is as large as 0.598 nm, so that the lattice mismatch with the single crystal substrate is made as large as 6%. Accordingly, when the defect type compound layer is not inserted, during growth of the p-type InGaAs layer 90, dislocations are generated in the p-type InGaAs layer 90, thus increasing the contact resistance of the electrode to the base layer. However, in this embodiment, by insertion of the defect type compound layer 80, the density of dislocations is reduced, to obtain the electrode with a small contact resistance.

In this embodiment, the defect type compound layer is provided at the portion where heterojunction is formed; however, the present invention is not limited thereto, and may be provided at the other portions. Namely, when the same compound semiconductor layers are formed on the upper and lower sides of the defect type compound layer, if the film thickness of the compound semiconductor layer interposed between the heterojunction and the defect type compound layer is small not to generate dislocations during formation of this layer, it is possible to obtain the effect of the present invention.

The present invention is not limited to III–V group compound semiconductors and III-group semiconductor, and may be applied to other semiconductors, with the same effect.

The present invention provides a layered structure of different semiconductors with less defect which is capable of suppressing the generation of dislocations due to the difference in the lattice constant. Moreover, it becomes possible to fabricate a semiconductor device using the layered structure of different semiconductors with less deterioration of the characteristics due to defects.

What is claimed is:

1. A semiconductor device having at least one semiconductor layered structure, each semiconductor layered structure comprising:

a single crystal substrate;

a semiconductor single crystal growth layer which is formed on said single crystal substrate; and a defect type compound layer inserted between said single crystal substrate and said single crystal growth layer so as to be contacted therewith, the defect type compound layer being made of at least one defect type compound having a crystal structure in which part of lattice sites of the crystal structure is vacant;

wherein materials of said single crystal substrate and said single crystal growth layer and a thickness of said single crystal growth layer are determined such that, when another single crystal substrate made of a same material as that of said single crystal substrate is prepared, and a layer made of a same material as that of said single crystal growth layer is directly grown on the another single crystal substrate to a same thickness as that of said single crystal growth layer without any defect type compound layer, dislocations are generated in the layer made of the same material as that of said single crystal growth layer; and a thickness of said defect type compound layer is determined such that, when another single crystal substrate made of the same material as said single-crystal substrate is prepared, and a layer made of a same material as that of said defect type compound layer is directly grown on the another single crystal substrate to a same thickness as that of said defect type compound layer without any single crystal growth layer, any dislocation is not generated in the layer made of the same material as that of said defect type compound layer.

2. A semiconductor device according to claim 1, wherein the material of said single crystal substrate is a semiconductor.

3. A semiconductor device according to claim 1, wherein said defect type compound layer includes a plurality of sub-layers of the at least one defect type compound, the device having a structure that layers made of a same material as that of said single crystal growth layer and the sub-layers are alternately stacked, the alternately stacked layers and sub-layers being positioned between the substrate and growth layer, and both an uppermost layer and a lowermost layer of the alternately stacked layers and sub-layers are composed of the sub-layers of said at least one defect type compound; and a thickness of each of the plurality of sub-layers made of the at least one defect type compound is such that, when a layer of said at least one defect type compound is formed on said single crystal substrate or the layer made of the same material as that of said single crystal growth layer, no dislocation is generated in the layer made of the at least one defect type compound.

4. A semiconductor device according to claim 2, wherein the material of said single crystal substrate is selected from a group consisting of Si, GaAs and InP.

5. A semiconductor device according to claim 4, wherein the material of said single crystal growth layer is selected from a group consisting of GaAs, AlGaAs, InGaAs, and InAlAs.

6. A semiconductor device according to claim 5, wherein said defect type compound layer is one selected from the group consisting of a $Ga_2Se_3$ layer and a $Ga_2S_3$ layer.

7. A semiconductor device according to claim 1, wherein an ohmic electrode is formed on said single crystal growth layer so as to be contacted therewith; and wherein said single crystal growth layer is of a conductivity type selected from the group consisting of n-type conductivity and p-type conductivity, when said single crystal growth layer is of the n-type conductivity, an electron energy at a minimum of a conduction band of said single crystal growth layer is smaller than that of said single crystal substrate, and when said single crystal growth layer is of the p-type conductivity, an electron energy at a maximum of a valence band of said single crystal growth layer is larger than that of said single crystal substrate.

8. A semiconductor device according to claim 7, wherein said single crystal substrate includes a conducting channel layer of a field effect transistor, said single crystal growth layer includes two single crystal growth layer portions, which respectively are disposed on side surfaces of said conducting channel layer by way of said defect type compound layer, and said ohmic electrode includes two ohmic electrode portions which respectively constitute a source electrode and a drain electrode.

9. A semiconductor device according to claim 7, wherein said single crystal substrate includes a base layer of a bipolar transistor, the base layer having side surfaces, said single crystal growth layer is disposed on the side surfaces of said base layer by way of said defect type compound layer, and said ohmic electrode constitutes a base electrode.

10. A semiconductor device according to claim 9, wherein said single crystal substrate includes a GaAs wafer, and an undoped GaAs layer, an n-type GaAs collector layer, a p-type GaAs base layer, and an n-type AlGaAs emitter layer which are sequentially formed on the GaAs wafer, said p-type GaAs base layer and said n-type AlGaAs emitter layer each having side surfaces; and said single crystal growth layer includes a p-type InGaAs layer, which is disposed on both of the side surfaces of said p-type GaAs base layer and of said n-type AlGaAs emitter layer and on an area of said n-type GaAs collector layer, continuous to said side surfaces of said p-type GaAs base layer, not covered with said p-type GaAs base layer and said n-type AlGaAs emitter layer, by way of said defect type compound layer, said defect type compound layer being composed of $Ga_2Se_3$.

11. A semiconductor device according to claim 1, wherein said single crystal growth layer includes a conducting channel layer of a field effect transistor.

12. A semiconductor device according to claim 11, wherein said single crystal substrate includes an Si substrate;

said defect type compound layer is a $Ga_2Se_3$ layer;

said single crystal growth layer is an undoped GaAs layer that constitutes said conducting channel layer and is disposed on the Si substrate by way of said defect type compound layer of $Ga_2Se_3$;

an n-type AlGaAs layer is formed on said undoped GaAs layer;

a source electrode and a drain electrode are disposed on paid n-type AlGaAs layer by way of a GaAs cap layer; and a gate electrode is formed on said n-type AlGaAs layer in a recess portion constituted of said GaAs cap layer.

13. A semiconductor device according to claim 8, wherein said conducting channel layer is an n-type InGaAs layer, said single crystal growth layer is an n-type InGaAs layer, and said defect type compound layer is a $Ga_2Se_3$ layer.

14. A semiconductor device according to claim 1, which includes two semiconductor layered structures, said single crystal growth layer of one of the two semiconductor layered structures including a conducting channel layer of a field effect transistor, and wherein the single crystal growth layer of the other of the two semiconductor layered structures has two single crystal growth layer portions respectively serving as a source and a drain of said field effect transistor, the single crystal growth layer of said one of the two semiconductor layered structures being said single crystal substrate of the other of the two semiconductor layered structures.

15. A semiconductor device according to claim 14, wherein said single crystal growth layer of said one of the two semiconductor layered structures includes an undoped InGaAs conducting channel layer, which is disposed on said single crystal substrate composed of a GaAs substrate and an undoped GaAs layer formed on said GaAs substrate, by way of said defect type compound layer composed of a $Ga_2Se_3$ layer, said single crystal growth layer of the other of the two semiconductor layered structures constitutes an n-type AlGaAs carrier supply layer, which is disposed on said conducting channel layer by way of said defect type compound layer composed of a $Ga_2Se_3$ layer, a source electrode and a drain electrode are disposed on said n-type AlGaAs carrier supply layer by way of a GaAs cap layer, and a gate electrode is formed on said n-type AlGaAs carrier supply layer in the recess portion composed of said GaAs cap layer.

16. A semiconductor device according to claim 1, wherein said single crystal growth layer includes a buffer layer to the substrate of a bipolar transistor, and an active portion of said bipolar transistor is formed on said buffer layer.

17. A semiconductor device according to claim 16, wherein said single crystal substrate includes an Si substrate, and said single crystal growth layer includes an undoped GaAs layer and is disposed on said single crystal substrate by way of said defect type compound layer composed of a $Ga_2Se_3$ layer.

18. A semiconductor device according to claim 1, which includes two semiconductor layered structures, wherein said single crystal growth layer of one of the two semiconductor layered structures includes a base layer of a heterojunction bipolar transistor, and said single crystal growth layer of the other of the two semiconductor layered structures includes an emitter layer of said heterojunction bipolar transistor, and said single crystal growth layer of the one of the two semiconductor layered structures also is the single crystal substrate of the other of the two semiconductor layered structures.

19. A semiconductor device according to claim 18, wherein said base layer contained in said single crystal growth layer of said one of the two semiconductor layered structures is made of a p-type $In_xGa_{1-x}As$ (x=0.8 to 1.0), and which is formed on said single crystal substrate composed of an InP substrate, an undoped InP layer and n-type $In_yGa_{1-y}As$ collector (y=0.53) being sequentially formed on said InP substrate, by way of said defect type compound layer composed of a $Ga_2Se_3$ layer, and said emitter layer contained in said single crystal growth layer of the other of the two semiconductor layered structures is made of an n-type $In_zAl_{1-z}As$ (z=0.53) and which is formed on said base layer by way of said defect type compound layer composed of a $Ga_2Se_3$ layer.

20. A semiconductor device according to claim 1, wherein the at least one defect type compound has a stoichiometric composition but has part of the lattice sites of the crystal structure thereof vacant.

21. A semiconductor device according to claim 1, wherein the at least one defect type compound is a chalcogenite of a Group III element.

22. A semiconductor device according to claim 1, wherein the at least one defect type compound includes a compound selected from the group consisting of $Ag_2HgI_4$ and $HgGa_2Te_4$.

23. A semiconductor device according to claim 1, wherein the at least one defect type compound includes a mixture of defect type compounds.

24. A semiconductor device according to claim 1, wherein the defect type compound layer is a layer formed by reacting material of the single crystal substrate with at least one other element so as to form the at least one defect type compound.

25. A semiconductor device according to claim 1, wherein the defect type compound layer is provided in an active region of the semiconductor device.

* * * * *